United States Patent [19]

Cohen et al.

[11] 4,331,712
[45] May 25, 1982

[54] PROCESS FOR APPLYING DRY PARTICULATE MATERIAL TO A TACKY SURFACE

[75] Inventors: Abraham B. Cohen, Springfield; Michael J. Krawacki, Union, both of N.J.

[73] Assignee: E. I. Du Pont de Nemours and Company, Wilmington, Del.

[21] Appl. No.: 852,703

[22] Filed: Nov. 18, 1977

Related U.S. Application Data

[63] Continuation of Ser. No. 693,948, Jun. 8, 1976, abandoned, which is a continuation of Ser. No. 524,204, Nov. 15, 1974, abandoned.

[51] Int. Cl.³ .............................................. B05D 1/36
[52] U.S. Cl. ..................................... 427/202; 427/368
[58] Field of Search .................. 427/21, 45, 189, 194, 427/195, 198, 202–208, 428, 368

[56] References Cited

U.S. PATENT DOCUMENTS

| | | | |
|---|---|---|---|
| 2,894,744 | 7/1959 | Schulze | 271/51 |
| 2,959,153 | 11/1960 | Hider | 118/637 |
| 3,027,271 | 3/1962 | Plasse et al. | 427/202 X |
| 3,060,024 | 10/1962 | Burg et al. | 96/28 |
| 3,464,353 | 9/1969 | Bach et al. | 101/470 |
| 3,632,370 | 1/1972 | Weizer | 427/21 |
| 3,649,268 | 3/1972 | Chu et al. | 96/27 R |
| 3,754,912 | 4/1973 | Jones et al. | 96/36 |
| 3,762,944 | 10/1973 | Sloan et al. | 101/473 |
| 3,767,446 | 10/1973 | Weiler | 355/3 |

*Primary Examiner*—Bernard D. Pianalto

[57] ABSTRACT

A process is described to uniformly apply finely divided material to tacky surfaces. The process comprises the physical treatment of particulate material to reduce particle aggregates to smaller particles and depositing the particles on the tacky surface with substantially no shearing force. The particle covered surface is then worked or rubbed with a shearing force to redistribute and embed the particles into the tacky surface. By this process, surfaces which are uniformly tacky or which contain tacky image areas can be uniformly and consistently toned without the production of defects like streaks or mottle.

5 Claims, 5 Drawing Figures

PROCESS FOR APPLYING DRY PARTICULATE MATERIAL TO A TACKY SURFACE

CROSS-REFERENCES

This is a continuation of our application Ser. No. 693,948, filed June 8, 1976, now abandoned, which was a continuation of our application Ser. No. 524,204, filed Nov. 15, 1974, now abandoned.

BACKGROUND OF THE INVENTION

1. Field of the Invention

This invention relates to the process of applying finely divided material to tacky surfaces. More particularly this invention relates to image reproduction systems, and still more particularly to image reproduction systems involving the application of toner particles over a tacky surface to develop a latent image.

2. Description of the Prior Art

The advent of electrophotography and wide acceptance of electrostatic reproduction methods have resulted in a large number of processes and devices to apply toner particles on a charged surface. Methods of applying electroscopic toner by sprinkling or dusting, cascading, transferring, brushing, etc., are well known.

In the graphic arts area, powdered materials are sometimes applied to tacky surface areas to make images and particularly multicolor images such as described in U.S. Pat. No. 3,649,268, and the patents referred to therein. Following imagewise exposure of such a film, the latent image is developed by the application of toner particles on the surface, and subsequent removal of the particles from nonimage areas by brushing away loose toner, as disclosed in U.S. Pat. No. 3,060,024. It has also been known in the art to use a small pad having a handle on one side and a thick pile such as lambs wool on the other to apply and distribute the toner over the latent image bearing surface. The pad is dipped in a dish containing a supply of toner; it is then rubbed lightly and repeatedly in an S type path over the latent image bearing surface. Since there are areas of different degrees of tackiness on this surface, toner particles adhere on the tacky sections to develop an image. The shearing force present during the application of the toner because of the sideways motion of the pad often results in a streaked appearance particularly in large solid areas in the final image.

To avoid this, the toner may be applied by patting a pad dipped in toner all over the surface and then using the pad to rub the surface with an S type motion as before. This tends to eliminate streaks, however, the patting motion generates an objectionable dust cloud, and requires special measures or equipment control. In addition, there is no way to control the uniformity and amount of applied toner, which results in variations on the top density over areas of the image, especially when the method is used by an inexperienced operator.

Finally, the use of a rotating, or a rotating and oscillating cylindrical brush to obtain embedding of toner particles in powder receptive areas is suggested in U.S. Pat. No. 3,754,912. This method employs a shearing or brushing force in the application of toner. What is needed is a convenient, speedy process whereby a uniform layer of toner may be applied reproducibly over a surface to develop a uniform image without depositing a great excess of toner or generating a dust cloud, nonuniform solid areas, streaks, mottle, or variable top densities from operator to operator.

SUMMARY OF THE INVENTION

It is an object of the invention to provide a process for the application of particulate material to a tacky surface.

It is a further object of this invention to provide a convenient and speedy process which applies toner in a uniform and controlled manner, resulting in toned areas free of streaks, with predictable and uniform top density and without generating a dust cloud or wasting toners.

Accordingly, a process of this invention for uniformly applying particulate material to a tacky surface comprises:

(a) breaking up aggregates of the particulate material to form smaller particles of controlled size;
(b) dispensing the particles to a depositing means;
(c) depositing the particles at a controlled rate on said tacky surface without imparting substantially any shearing force to said surface area; and
(d) embedding the particles in the surface using a shearing force.

In one embodiment of this invention, the surface to which particulate toner material is applied comprises an imaged surface having tacky and non-tacky areas imagewise disposed thereon. In another embodiment of this invention, after step (c), toner deposition can optionally be continued concurrently with step (d) so that particles continue to be deposited while the surface is being worked with a shearing force. In this embodiment, the particle covered surface would be further worked after toner deposition was discontinued. In still another embodiment of this invention, aggregates of particulate toner material are broken up into smaller particles by a sieving operation concurrent with depositing the toner particles with a roller type applicator which traverses the surface without imparting shear while depositing a substantially uniform toner layer over the tacky surface. In this embodiment, toner particle size and depositing rate are controlled by the dimensions of the sieve, i.e., mesh size, and the agitation of the sieve.

DESCRIPTION OF THE PREFERRED EMBODIMENTS

Figure 1:
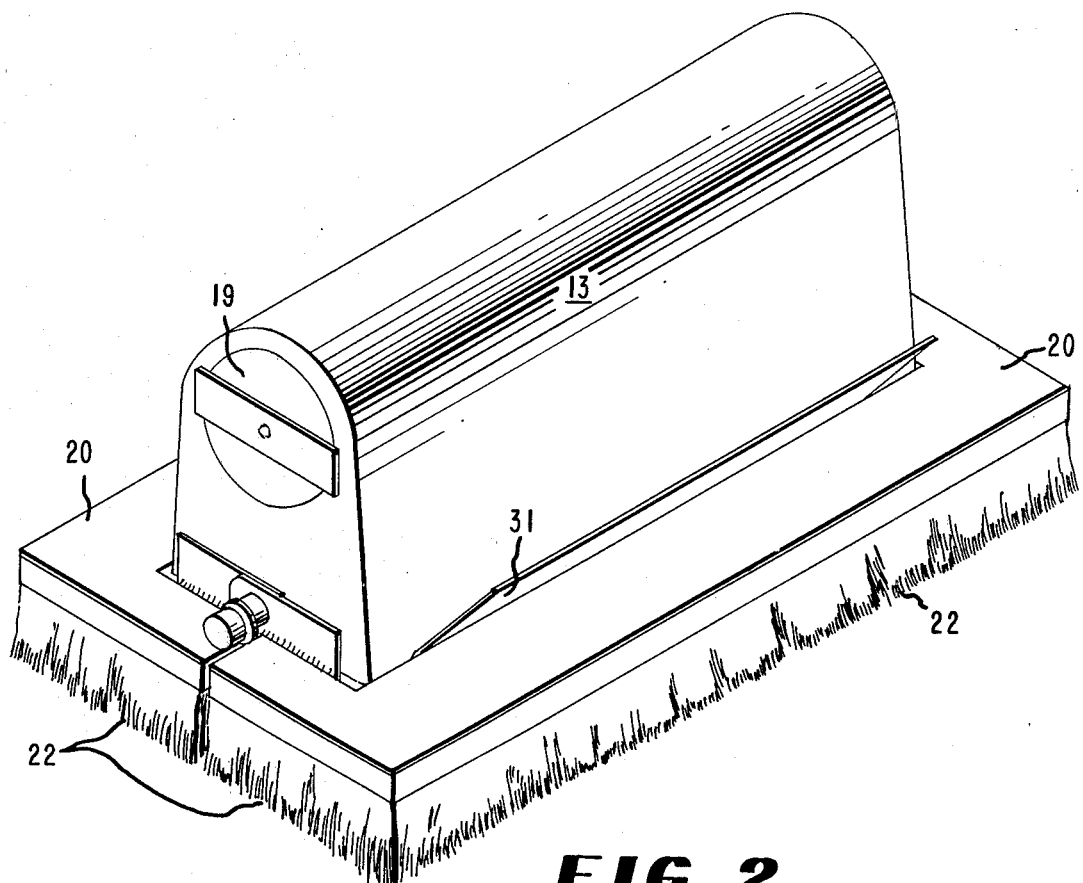
FIG. 1 is a perspective view of the applicator device with the wing pads in working position.

In practicing the invention, an element useful in an image reproduction process of the type disclosed in U.S. Pat. No. 3,649,268 may be selected. Such an element following an imagewise exposure will bear on its surface a latent image and will imagewise exhibit different degrees of tackiness. When toner particles are sprinkled on such a surface, they tend to adhere on the tacky sections and develop a visible image. It has now been discovered that a particular sequence of operations and techniques in breaking up, depositing and embedding the toner particles in the tacky areas of the image reproduction element results in a superior final product which is substantially free of streaks, exhibits excellent density uniformity and results in good repeatability as measured in terms of density and density uniformity even when relatively unskilled or different operators are employed in the toning operation. In addition, the time required to finish a given area has been reduced and toner waste almost eliminated.

In the most preferred process of this invention, an imagewise exposed photosensitive layer having a latent image of tacky areas and non-tacky areas on its surface is developed by uniformly applying particulate toner to the surface of the layer by a process which comprises
  (a) dispensing particulate toner from a cylindrical sieve in a housing, the sieve being free to move laterally within the housing, onto the surface of a roller at a rate related to the rate of revolution of the roller;
  (b) depositing the toner particles on the surface of the layer by rolling the roller across the surface of the layer without any substantial shearing force; and
  (c) embedding the toner particles in the tacky areas of the surface of the layer with a force having a shear component.

The rate of dispensing the toner from the sieve onto the roller is approximately proportional to the rate of revolution of the roller. As the cylindrical sieve turns, aggregates of particulate toner are broken up and so can be dispensed to the roller. The cylindrical sieve is free to move laterally and is a cylinder which may have a circular or non-circular cross section.

In a preferred embodiment of the invention, a photohardenable, image reproduction element is prepared substantially as described in U.S. Pat. No. 3,649,268, Example I. Following imagewise exposure and removal of the polyethylene terephthalate film base, the unhardened, tacky image areas are toned as described in the preferred process above. Any excess toner may then be removed by wiping or blowing with an air hose. Although the toning process of this invention is particularly useful for developing tacky latent images in exposed photosensitive elements, it can be used to uniformly tone any tacky surface. Thus a tacky material may be applied to a surface and the tacky surface pigmented by the process of this invention to give a decorative, colored surface free of defects such as streaks or mottle or differences in density.

Toners which are applied by the process of this invention include finely divided particulate materials such as colorants, e.g., pigments, dyes and particularly colorants disclosed in Chu et al., U.S. Pat. No. 3,620,726. Additionally, other finely divided materials besides colorants can be used as toners such as magnetic materials, electrical or heat conducting materials, matting agents, hydrophilic or hydrophobic materials etc. Toner particles generally tend to aggregate and form small clumps of varying sizes. When these clumps are deposited on a tacky surface, they tend to break up when they are worked or rubbed into the surface and can result in surface defects, either in the form of a dark or light spot or streak or in a general density difference. The process of this invention markedly reduces or eliminates such defects and consequently permits the use of a wide variety of toner materials.

Aggregates of toner particulate material may be broken up by any mechanical process provided that new large aggregates are not allowed to reform. Thus, in the preferred embodiment, toner aggregates are broken up by a sieve and the smaller particles are sifted evenly onto an applicator surface from which the toner particles are deposited. When the depositing means is in the form of a roller, the particles are deposited on the tacky surface to be toned as the roller surface contacts the surface. In such an embodiment, the sieve is preferably cylindrical, resting on and driven by the depositing roller, and free to move laterally (perpendicularly to its axis) within the housing. The freedom of lateral movement may be restricted by an adjustably positionable member between the sieve and the housing. The break up of toner aggregates can precede the dispensing and depositing or it can be concurrent therewith. Thus a fluidized bed of toner particles or a confined cloud of toner particles can be produced by suitable agitation of the toner material wherein aggregates are broken down and prevented from reforming by the continued agitation. Toner is then deposited on a tacky surface by simply passing the surface through the bed or cloud at a constant rate. The size of the particulate toner material being dispensed will depend on toner type, the type and extent of mechanical agitation as well as the ambient environmental conditions. A toner having a controlled particle size will therefore be a toner being dispensed which is produced by a substantially constant agitation procedure in a known or constant environment. The ultimate particle size, of course, is the size of an individual toner particle which is not weakly or physically associated with another such particle.

Following or concurrent with the break up of toner aggregates, the toner particles are dispensed at a controlled rate and deposited to cover substantially all of the tacky surface without imparting shear force to the surface. The rate of delivery of toner is controlled to prevent excess deposition or release which results in toner waste and the possible generation of an unconfined and therefore objectionable dust cloud. Toner is metered out and applied in a generally uniform fashion over the surface. This can be achieved economically by using a roller applicator on which a metered quantity of toner is constantly dispensed by sifting as described above. As the roller rolls over the latent image bearing surface, toner particles are deposited on the surface and adhere to the tacky areas, laying on them a substantially uniform layer. The quantity of toner powder adhered will ultimately determine top density, while the rate at which it is delivered will assure the most efficient application. Preferably, sufficient toner to obtain final top density should be released in a single pass. Higher delivery rates will result in lower waste and lower rates in the need to repeat the operation. The applicator which deposits the particulate toner without shear is preferably a roll applicator as described above, a bank of roll applicators, a continuous web or belt, or a simple plane sheet, in each case having a surface which temporarily accepts and holds a substantially uniform amount of toner particles and has less attraction for the toner than the adherence of the toner to the tacky surface. Suitable such applicator surfaces include short plush surfaces, slightly tacky surfaces, etc. When the applicator is a roll, bank of rolls or continuous belt, the surface containing the toner particles is rolled onto the tacky surface with moderate pressure. When the applicator is a sheet, the surface with the toner is simply pressed onto the tacky surface and then removed.

Another method of depositing the toner particles is by passing the latent image bearing surface through a fluidized bed of toner particles. Because of the surface tackiness, toner will adhere to the tacky sections and very little if any will stay in the non-tacky areas. The same result can be obtained by passing the latent image bearing surface through a confined toner cloud, allowing toner to be picked up by the tacky areas, again generating a substantially uniform layer of toner over the tacky sections of the surface.

It should be noted that in all of the above described methods of toner distribution over the tacky areas of the latent image bearing surface, the toner is applied thereon without exerting any, or substantially any, shearing forces on said surface. This is important, since it has been found that the presence of shearing forces on the image bearing surface, before the application of a first relatively uniform layer of toner particles over the tacky areas results in streaks in the final product.

After a layer of toner particles has been deposited to cover the tacky surface, the toner particles are worked into the tacky surface using a shearing force (e.g., rubbing). The toner covered surface can be rubbed with a soft pad such as cotton, lambs wool, acrylic pile, mohair, etc. or it can be brushed with a soft bristle brush, e.g., camel hair. The pad or brush is moved to and fro over the toned surface using light pressure in combination with the lateral shearing force to redistribute and embed the toner into the tacky areas and develop the latent image. Shearing force applied after the toner is deposited is not detrimental and, on the contrary, appears necessary to achieve better uniformity of top and bottom density in the final image.

Photohardenable layers are those having imagewise tacky and non-tacky areas when imagewise exposed to actinic radiation. Such compositions are selected from photopolymerizable, photocrosslinkable, and photodimerizable materials. Particularly preferred are photopolymerizable materials having a macromolecular organic polymer binder, an ethylenically unsaturated, addition-polymerization compound, and a free-radical generating polymerization initiator activatable by actinic radiation.

Figure 3:
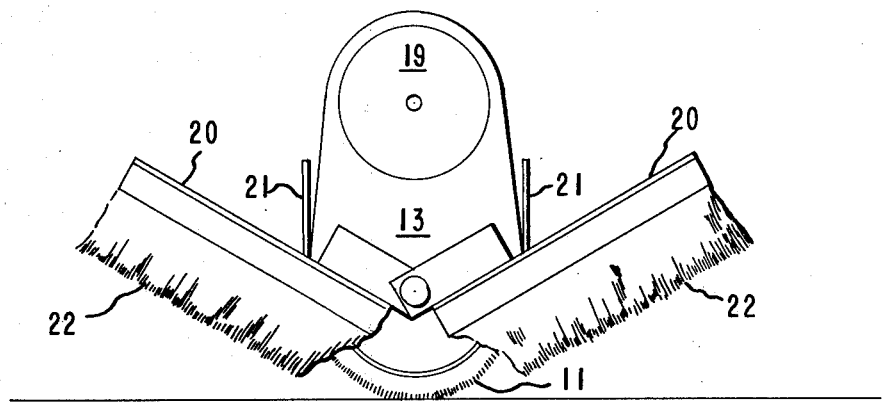
FIG. 3 is a schematic view demonstrating deposition of particulate material using the device of FIG. 1.
Figure 4:
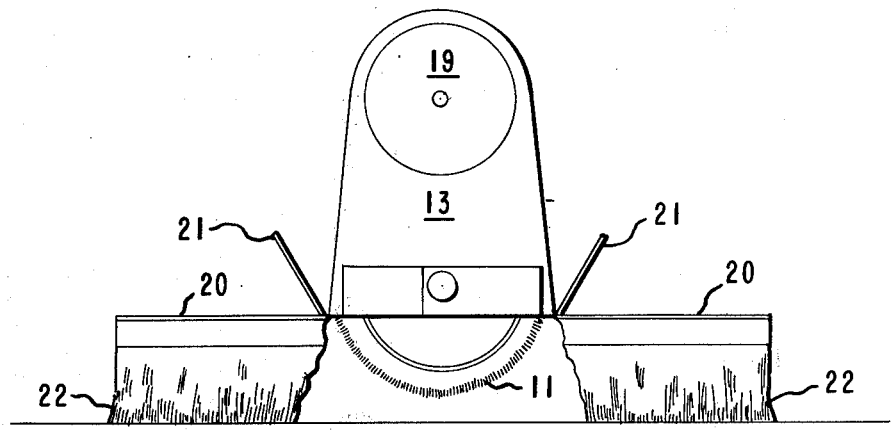
FIG. 4 is a schematic view demonstrating embedding the material into a tacky surface using the device of FIG. 1.
Figure 5:
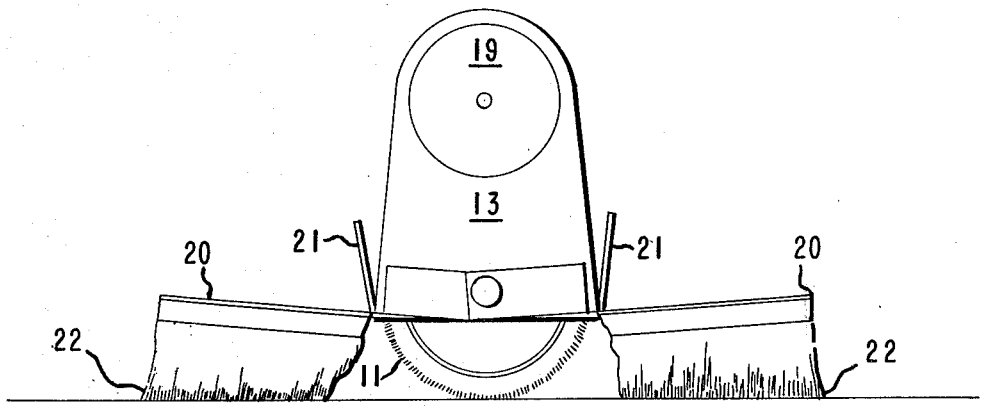
FIG. 5 is a schematic view demonstrating concurrent dispensing, deposition and embedding of the material into a tacky surface using the device in FIG. 1.

A preferred device useful in the process of this invention is illustrated in the attached drawings. Referring to the figures, a device particularly useful in the preferred process of this invention will be described. A roller applicator 11 is mounted by means of an axle 12 to the open end of a housing 13 so that the applicator 11 freely rotates about the axle and so that the roll applicator surface 14 extends outside of the open bottom of the housing 13. An elongated sifting means 15 comprising a cylindrical container having a plurality of holes distributed circumferentially thereon is confined within the housing 13 by the roll applicator 11 and baffles 16. The baffles 16 run parallel to the applicator 11 and sifting means 15 and are attached to the housing at points between the axis of the roll applicator and the axis of the sifting means. The sifting means 15 is laterally free moving within the housing 13 and its outer surface is in contact with the top surface 17 of the roll applicator 11 so that it can be rotated and moved from side to side as the roll applicator is rotated in alternate directions. An adjustably positionable member 23 may be used to govern the freedom of lateral movement of the cylindrical sieve within the housing and thereby govern the rate of dispensing from the sieve. Particulate toner material 18 is contained within the cavity of the sieving means 15. The sieving means 15 may be removed from the housing 13 for filling with toner material by first removing the cap 19 on the housing 13. Around the opening of the housing 13 two pad sections 20 or wing pads are hinged on the axle 12 so that they can be retracted up around the housing 11, or be lowered parallel to the housing opening by squeezing or releasing handles 21. When the wing pads are retracted only the surface of the roll applicator 14 touches when the device is moved over a surface to and fro as in FIG. 3. When the wing pads are fully lowered only the pad areas 22 touch when the device is moved over a surface to and fro as in FIG. 4. When the wing pads are only partially retracted, for instance when downward pressure is placed on the housing 13, both the roll applicator surface 14 and the pad area 22 touch the surface when the device is moved to and fro as in FIG. 5.

The invention is illustrated by the following examples.

EXAMPLE 1

A photopolymerizable element similar to that of Example I, U.S. Pat. No. 3,649,268 is prepared having a 0.0003 inch (~0.0076 cm) photopolymer layer coated on 0.0005 inch (0.0013 cm) polyethylene terephthalate support, with the other side of the photopolymer layer covered with a 0.00075 inch (~0.0019 cm) polypropylene film as a cover sheet. As in Example I, U.S. Pat. No. 3,649,268, the cover sheet is removed, the photopolymer layer laminated to Kromekote, one side cast coated cover paper, and exposed to actinic radiation. During exposure, a large central panel is masked to prevent any exposure and to produce an area of uniform tackiness. Three exposed elements are prepared in this manner and toned by the following procedures.

Conventional Toning Procedure

The exposed element was secured to a flat surface and the polyethylene terephthalate film is removed. A pad applicator of lamb's wool fleece is dipped into powdered magenta toner similar to that disclosed in U.S. Pat. No. 3,649,268 and with a continuous S type motion was smoothly, and without applying pressure moved to-and-fro across the surface of the exposed element, and then up-and-down across the surface. This toning procedure is continued for 10 complete cycles, and then the excess toner was carefully wiped off without applying pressure with a piece of antistatic treated flannel cloth. The resulting magenta panel is heavily streaked in a horizontal direction. Ten densities are measured across the face of the panel using a conventional reflection densitometer. The densities vary from 1.22 to 1.11 with an average density being 1.16.

Bimodal Toning

A second exposed element is secured to a flat surface and the polyethylene terephthalate film is removed. The same magenta toner as above is placed in the cylindrical sieving means 15 of the device depicted in FIG. 1 and FIG. 2. As in FIG. 3 the device with the wing pads 20 retracted is moved to-and-fro across the tacky surface and then up-and-down across the surface so that the roller 11 covers each portion of the tacky surface once in each direction. This procedure continues for 5 complete cycles, then the wing pads 20 are lowered with the resulting disengagement of the roller from the surface as in FIG. 4 and the same motion as above is continued for 5 more cycles. The small excess of toner is removed carefully with an antistatic cloth as described above. The resulting magenta panel is virtually free of streaks and density across the panel is significantly more uniform. Average density is 1.05 and density only varies from 1.08 to 1.03.

Trimodal Toning

Figure 2:
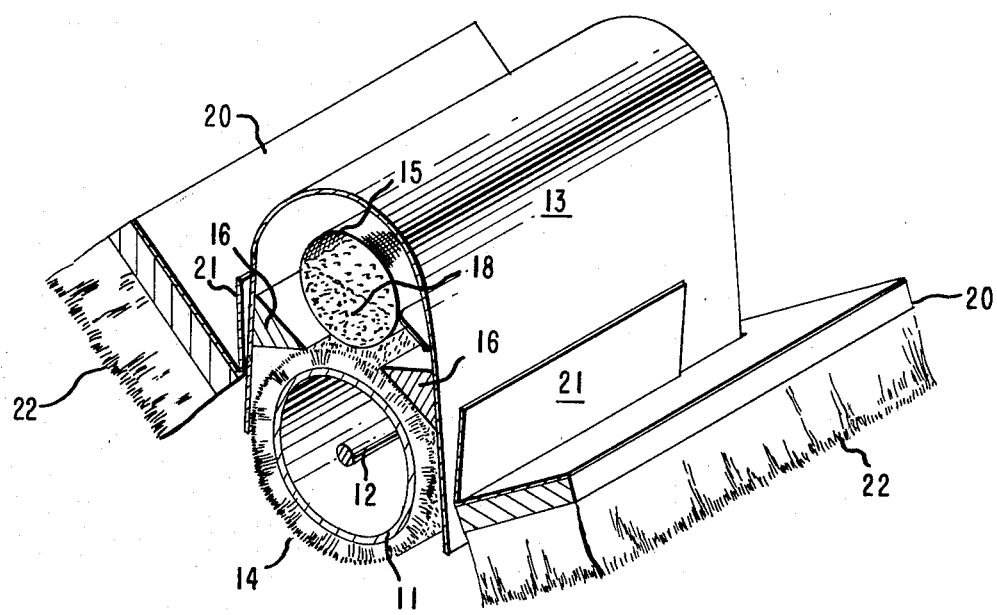
FIG. 2 is a cross section view of the applicator device with the wing pads retracted upward.

A third exposed element is secured to a flat surface and the polyethylene terephthalate film is removed The cylindrical sieving means 15 of the device depicted in FIG. 1 and FIG. 2 is charged with magenta toner as above. The device with the wing pads 20 retracted is moved as in FIG. 3 to-and-fro across the tacky surface, so that roller 11 covers each portion of the tacky surface. The wing pads 20 are then partially lowered, so that both roller surface 14 and the pad areas are in contact with the surface to be toned. In this position the device is moved as in FIG. 5 to-and-fro across the surface and then up-and-down across the surface, so that each portion of the surface is treated once in each direction. This procedure continues for 5 complete cycles when the wing pads 20 are fully lowered with the resulting disengagement of the roller from the surface as in FIG. 4 and the same motion is continued for two more cycles. The resulting magenta panel is free of streaks, and is substantially uniform in reflection density with an average density of 1.18 and variations within measurement error of 0.02.

EXAMPLE 2

A photopolymerizable element is prepared, the photopolymer layer laminated to Kromekote paper and then exposed to actinic radiation as in Example 1. However, exposure to actinic radiation is through an image bearing transparency. The polyethylene terephthalate film sheet is removed and the imagewise exposed surface is immersed in a cloud of magenta toner. The toner cloud is produced within an enclosure by blowing toner through a screen with air jets. The immersed element is held vertically, so that toner would not settle on the surface. After two minutes, the element is removed from the cloud and had toner adhering only to the unexposed tacky image areas. The element is then secured to a flat surface and the toner covered surface is worked with a lamb's wool pad, embedding the toner in the tacky areas of the surface, as described in the conventional toning procedure of Example 1. Excess toner is removed with an antistatic cloth to produce a magenta image with no apparent streak or mottle defects on a clean background.

EXAMPLE 3

A four-color halftone positive is prepared as in Example I of U.S. Pat. No. 3,649,268 except that the trimodal toning procedure described in Example 1 of this application is used to apply the toners. Three additional four-color halftone positives are prepared in the same way. All four positives are free of mottle and streak defects and all four positives have substantially the same tonal rendition and density maxima demonstrating the improved consistency of the toning process.

EXAMPLE 4

The smooth surface of a sanded wood board is painted with shellac dissolved in alcohol and allowed to dry until a tacky surface is obtained. An applicator device which is the same as FIG. 1 and FIG. 2 except that it has no wing pads 20 is used to apply a Primrose Yellow toner (CI Pigment Yellow 34). The powdered toner is placed in the cylindrical sieving means, and the device is rolled back and forth over the tacky surface 5 times. The toner covered surface is then rubbed with a plush acrylic pad first in a circular motion along the length of the board, then 5 times back and forth over the length of the surface. The yellow surface is free of streaks and has a uniform yellow appearance.

What is claimed is:

1. A process for uniformly applying a dry particulate material to a tacky surface comprising:
   (a) breaking up aggregates of the dry particulate material using a sieve to form small particles of controlled size;
   (b) dispensing dry particles at a controlled rate from said sieve to a roller;
   (c) concurrently therewith and without permitting the dry particles to reaggregate, contacting said tacky surface with said roller to transfer said dry particles from said roller at said controlled rate uniformly onto said tacky surface without imparting any substantial shear force to said surface area; and
   (d) embedding the uniformly transferred, unaggregated dry particles in the tacky surface using a shear force.

2. A process according to claim 1 wherein transferring comprises rolling said roller across the tacky surface whereby particles are deposited on the tacky surface and wherein said use of shear force also redistributes some deposited particles before they are embedded.

3. A process according to claim 2 wherein said sieve is cylindrical, driven by said roller, and moved laterally of said roller during said dispensing.

4. A process according to claim 3 wherein said cylindrical sieve has a non-circular cross section.

5. A process according to claim 3 wherein the freedom of lateral movement of said cylindrical sieve is governed by an adjustably positionable member.

* * * * *